United States Patent
Hsieh et al.

(10) Patent No.: US 8,975,666 B2
(45) Date of Patent: Mar. 10, 2015

(54) MOS TRANSISTOR AND PROCESS THEREOF

(75) Inventors: Ya-Hsueh Hsieh, Kaohsiung (TW); Chi-Mao Hsu, Tainan (TW); Hsin-Fu Huang, Tainan (TW); Min-Chuan Tsai, New Taipei (TW); Chien-Hao Chen, Yun-Lin County (TW); Chi-Yuan Sun, Yulin County (TW); Wei-Yu Chen, Tainan (TW); Chin-Fu Lin, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 136 days.

(21) Appl. No.: 13/591,226

(22) Filed: Aug. 22, 2012

(65) Prior Publication Data
US 2014/0054654 A1    Feb. 27, 2014

(51) Int. Cl.
| H01L 27/14 | (2006.01) |
| H01L 29/49 | (2006.01) |
| H01L 29/51 | (2006.01) |
| H01L 29/66 | (2006.01) |
| H01L 29/78 | (2006.01) |

(52) U.S. Cl.
CPC ...... *H01L 29/66545* (2013.01); *H01L 29/4966* (2013.01); *H01L 29/517* (2013.01); *H01L 29/78* (2013.01)
USPC .......... 257/213; 257/288; 257/327; 257/412; 257/410; 257/E21.409

(58) Field of Classification Search
USPC .......... 257/213, 288, 327, 412, 410, E21.409
See application file for complete search history.

(56) References Cited

U.S. PATENT DOCUMENTS

| 6,066,533 | A | 5/2000 | Yu |
| 6,492,217 | B1 | 12/2002 | Bai |
| 6,552,377 | B1 | 4/2003 | Yu |
| 6,696,345 | B2 | 2/2004 | Chau |
| 6,790,719 | B1 | 9/2004 | Adetutu |
| 6,794,234 | B2 | 9/2004 | Polishchuk |
| 6,902,969 | B2 | 6/2005 | Adetutu |
| 6,921,711 | B2 | 7/2005 | Cabral, Jr. |
| 7,030,430 | B2 | 4/2006 | Doczy |
| 7,074,664 | B1 | 7/2006 | White |
| 7,109,079 | B2 | 9/2006 | Schaeffer, III |
| 7,126,199 | B2 | 10/2006 | Doczy |
| 7,157,378 | B2 | 1/2007 | Brask |
| 7,193,893 | B2 | 3/2007 | Forbes |
| 7,208,366 | B2 | 4/2007 | Tsai |
| 7,381,619 | B2 | 6/2008 | Wang |
| 7,390,709 | B2 | 6/2008 | Doczy |
| 7,488,656 | B2 | 2/2009 | Cartier |
| 7,785,958 | B2 | 8/2010 | Doczy |
| 7,871,915 | B2 * | 1/2011 | Lim et al. ............ 438/592 |

(Continued)

OTHER PUBLICATIONS

Lin et al., Title: Metal Gate Structure, pending U.S. Appl. No. 13/086,397, filed Apr. 14, 2011.

*Primary Examiner* — Michael Shingleton
(74) *Attorney, Agent, or Firm* — Winston Hsu; Scott Margo

(57) ABSTRACT

A MOS transistor includes a gate structure on a substrate, and the gate structure includes a wetting layer, a transitional layer and a low resistivity material from bottom to top, wherein the transitional layer has the properties of a work function layer, and the gate structure does not have any work function layers. Moreover, the present invention provides a MOS transistor process forming said MOS transistor.

20 Claims, 5 Drawing Sheets

(56) References Cited

U.S. PATENT DOCUMENTS

| | | |
|---|---|---|
| 7,936,025 B2 * | 5/2011 | Chau et al. .................... 257/407 |
| 2002/0127888 A1 | 9/2002 | Cho |
| 2005/0095763 A1 | 5/2005 | Samavedam |
| 2005/0202659 A1 | 9/2005 | Li |
| 2005/0275035 A1 | 12/2005 | Mathew |
| 2006/0040482 A1 | 2/2006 | Yang |
| 2006/0054943 A1 | 3/2006 | Li |
| 2007/0037335 A1 | 2/2007 | Chambers |
| 2007/0082445 A1 | 4/2007 | Yang |
| 2007/0138559 A1 | 6/2007 | Bohr |
| 2007/0148838 A1 | 6/2007 | Doris |
| 2007/0210354 A1 | 9/2007 | Nabatame |
| 2008/0076216 A1 | 3/2008 | Pae |
| 2008/0318371 A1 | 12/2008 | Lin |
| 2009/0057787 A1 | 3/2009 | Matsuki |
| 2009/0166769 A1 | 7/2009 | Metz |
| 2010/0052074 A1 | 3/2010 | Lin |
| 2010/0068877 A1 | 3/2010 | Yeh |
| 2010/0081262 A1 | 4/2010 | Lim |
| 2012/0187563 A1 * | 7/2012 | Hsieh et al. .................... 257/751 |
| 2012/0315749 A1 * | 12/2012 | Hempel et al. ................ 438/591 |
| 2013/0015532 A1 * | 1/2013 | Kim et al. ...................... 257/380 |
| 2013/0063675 A1 * | 3/2013 | Misaki ............................ 349/46 |

* cited by examiner

MOS TRANSISTOR AND PROCESS THEREOF

BACKGROUND OF THE INVENTION

1. Field of the Invention

The present invention relates generally to a MOS transistor and a process thereof, and more specifically to a MOS transistor having a metal gate and a process thereof.

2. Description of the Prior Art

Poly-silicon is conventionally used as a gate electrode in semiconductor devices, such as the metal-oxide-semiconductor (MOS). With the trend towards scaling down the size of semiconductor devices, however, conventional poly-silicon gates face problems such as lower performances due to boron penetration and unavoidable depletion effect. This increases the equivalent thickness of the gate dielectric layer, reduces gate capacitance, and weakens a driving force of the devices. Therefore, work function metals that are suitable to be used as high-K gate dielectric layers are used to replace the conventional poly-silicon gates to serve as control electrodes.

SUMMARY OF THE INVENTION

The present invention provides a MOS transistor and a process thereof, which forms a transitional layer having the properties of a work function layer by diffusing a low resistivity material into a wetting layer, therefore having no work function layers formed in the MOS transistor.

The present invention provides a MOS transistor including a gate structure located on a substrate. The gate structure includes a wetting layer, a transitional layer and a low resistivity material from bottom to top, wherein the transitional layer has the properties of a work function layer, and the gate structure does not have any work function layers.

The present invention provides a MOS transistor process including the following steps. A gate structure is formed on a substrate, and the gate structure includes a wetting layer, a transitional layer and a low resistivity material from bottom to top, wherein the transitional layer is formed by the low resistivity material diffusing into the wetting layer, and the transitional layer has the properties of a work function layer, and the gate structure does not have any work function layers.

According to the above, the present invention provides a MOS transistor and a process thereof, which forms a wetting layer and a low resistivity material, and then a transitional layer is therefore formed between the wetting layer and the low resistivity material by ingredients of the low resistivity material diffusing into the wetting layer. The transitional layer has the properties of a work function layer, therefore not needing any work function layers to be formed in the MOS transistor. This way, the MOS transistor and process thereof can solve problems of filling difficulties and reduce the processing costs.

These and other objectives of the present invention will no doubt become obvious to those of ordinary skill in the art after reading the following detailed description of the preferred embodiment that is illustrated in the various figures and drawings.

DETAILED DESCRIPTION

Embodiments applying a gate-last for high-k first process paired with the present invention are presented in the following; however, in another embodiment, the present invention may also be paired with a gate-last for high-k last process, but it is not limited thereto.

Figure 1:
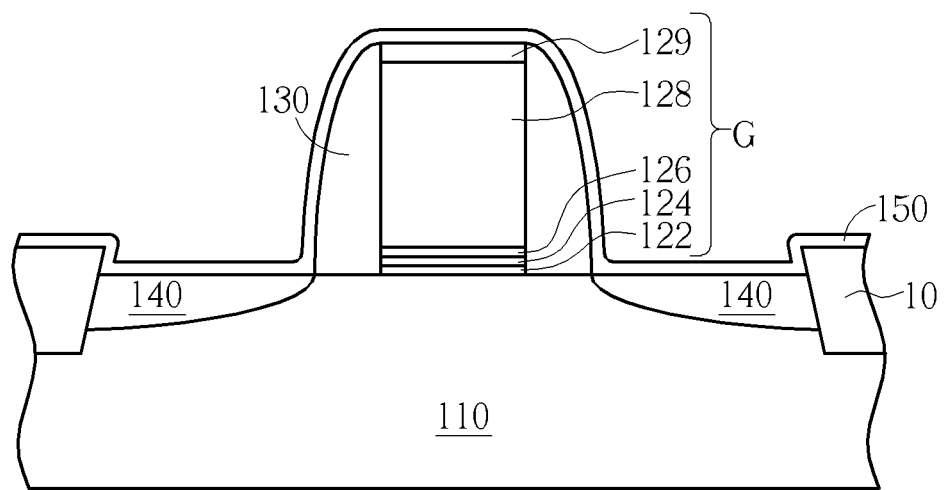
FIGS. 1-6 schematically depict cross-sectional views of a MOS transistor process according to a first embodiment of the present invention.

FIGS. 1-6 schematically depict cross-sectional views of a MOS transistor process according to a first embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. An isolation structure 10 is formed in the substrate 110 to electrically isolate each transistor. The isolation structure 10 may be a shallow trench isolation (STI) structure, which may be formed by a shallow trench isolation process, and the forming method is known in the art, and will not be described herein, but it is not limited thereto.

A buffer layer (not shown), a gate dielectric layer (not shown), a bottom barrier layer (not shown), a sacrificial electrode layer (not shown) and a cap layer (not shown) are sequentially formed from bottom to top and cover the substrate 110. The cap layer (not shown), the sacrificial electrode layer (not shown), the bottom barrier layer (not shown), the gate dielectric layer (not shown) and the buffer layer (not shown) are patterned to form a buffer layer 122, a gate dielectric layer 124, a bottom barrier layer 126, a sacrificial electrode layer 128 and a cap layer 129 on the substrate 110. This means that a sacrificial gate G including the buffer layer 122, the gate dielectric layer 124, the bottom barrier layer 126, the sacrificial electrode layer 128 and the cap layer 129 is formed.

The buffer layer 122 may be an oxide layer, which may be formed through a chemical oxide process or a thermal oxide process, but it is not limited thereto. The buffer layer 122 is located between the gate dielectric layer 124 and the substrate 110 to buffer the gate dielectric layer 124 and the substrate 110. A gate-last for high-k first process is applied in this embodiment, so that the gate dielectric layer 124 is a gate dielectric layer having a high dielectric constant, which may be the group selected from hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT), lead zirconate titanate (PbZrxTi1-xO3, PZT) and barium strontium titanate (BaxSr1-xTiO3, BST), but it is not limited thereto. In another embodiment, as a gate-last for high-k last process is applied, the gate dielectric layer 124 will be removed in later processes and then a gate dielectric layer having a high dielectric constant is formed. Therefore, the material of the gate dielectric layer 124 may be just a sacrificial material suitable for being removed in later processes. Perhaps, the gate dielectric layer 124 may not be formed, and a gate dielectric layer having a high dielectric constant may be formed as a gate dielectric layer instead after the sacrificial electrode layer 128 is removed. The bottom barrier layer 126 is located on the gate dielectric layer 124, which may be a single layer structure or a multilayer structure composed of tantalum nitride (TaN) or titanium nitride (TiN) etc. The sacrificial electrode layer 128 may be made of polysilicon, but it is not limited thereto. The cap layer 129 may be a single layer or a multilayer composed of a nitride layer or an oxide layer etc used for being a patterned hard mask.

A spacer 130 is formed on the substrate 110 beside the sacrificial gate G. An ion implantation process is performed to automatically align and form a source/drain 140 in the substrate 110 beside the spacer 130. The spacer 130 may be a single layer or a multilayer composed of silicon nitride or silicon oxide etc. A salicide process may be selectively performed to form a metal silicide (not shown) on the source/drain 140. A contact etch stop layer (CESL) 150 may be selectively formed to cover the gate structure G, the spacer 130 and the substrate 110. Moreover, a liner may be formed and an ion implantation process may be performed to form a lightly doped source/drain (not shown) before the ion implantation process is performed to form the source/drain 140.

Figure 2:
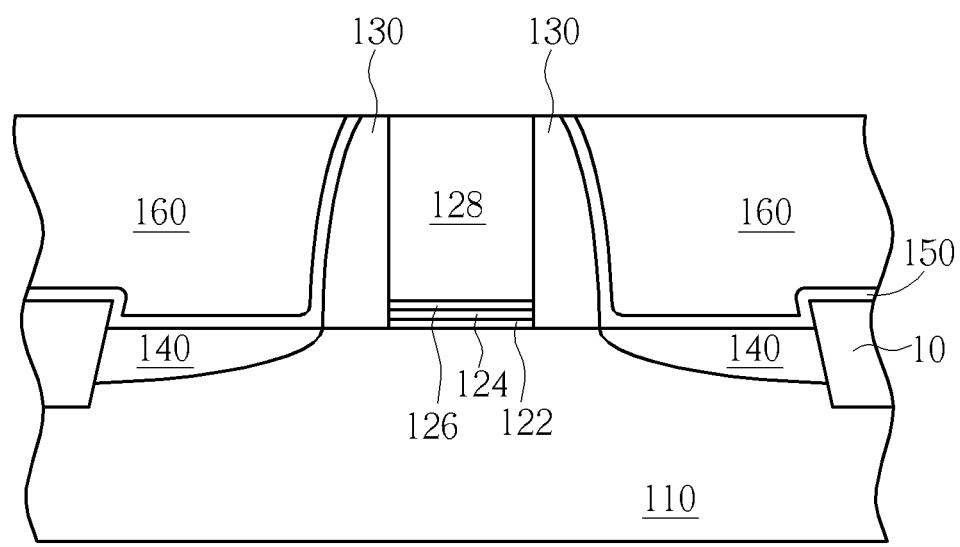
Figure 3:
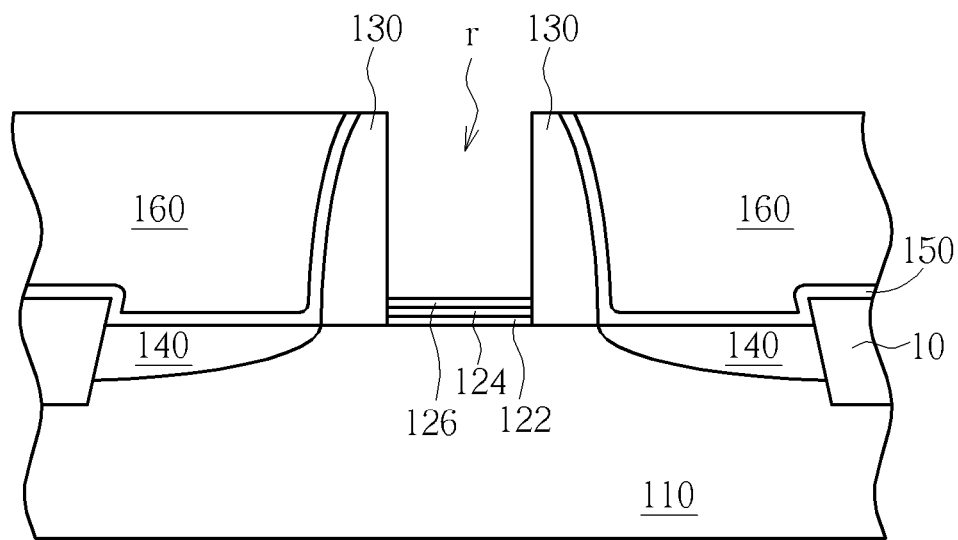

An interdielectric layer (not shown) covers the substrate 110 and the sacrificial gate G. Then, the interdielectric layer (not shown) is planarized until the contact etch stop layer (CESL) 150 and the cap layer 129 above the sacrificial electrode layer 128 are removed. So, an interdielectric layer 160 is formed and the sacrificial electrode layer 128 is exposed as shown in FIG. 2. Then, the sacrificial electrode layer 128 is removed, a recess r is therefore formed and the bottom barrier layer 126 is exposed as shown in FIG. 3.

Figure 4:
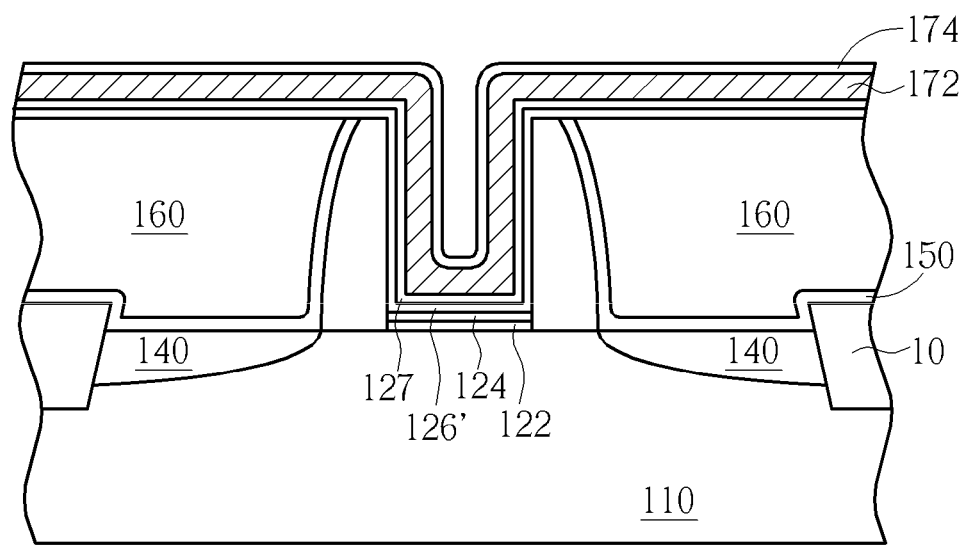

The bottom barrier layer 126 is removed, and then a U-shaped bottom barrier layer 126' is formed to cover the gate dielectric layer 124 and the interdielectric layer 160 as shown in FIG. 4, wherein the U-shaped bottom barrier layer 126' may be a single layer structure or a multilayer structure composed of tantalum nitride (TaN) or titanium nitride (TiN) etc. Then, an etching stop layer 127 is formed on the U-shaped bottom barrier layer 126', wherein the etching stop layer 127 may be composed of tantalum nitride (TaN) or etc for being as an etch stop layer while removing a work function layer of a P-type transistor in a CMOS transistor process. Thereafter, a work function layer 172 is formed to cover the etching stop layer 127. In this embodiment, the work function layer 172 is an aluminum titanium metal layer for forming an NMOS transistor, but it is not limited thereto. In another embodiment, the work function layer 172 may be another work function layer such as a titanium nitride layer or etc for forming a transistor with another electrical type. A top barrier layer 174 is formed on the work function layer 172. The top barrier layer 174 may be a titanium nitride layer or etc, for preventing ingredients of layers formed thereon in later processes from diffusing downward to the work function layer 172, the etching stop layer 127, the bottom barrier layer 126 or the gate dielectric layer 124 etc, which would degrade electrical performances of transistors such as work function values.

Figure 5:
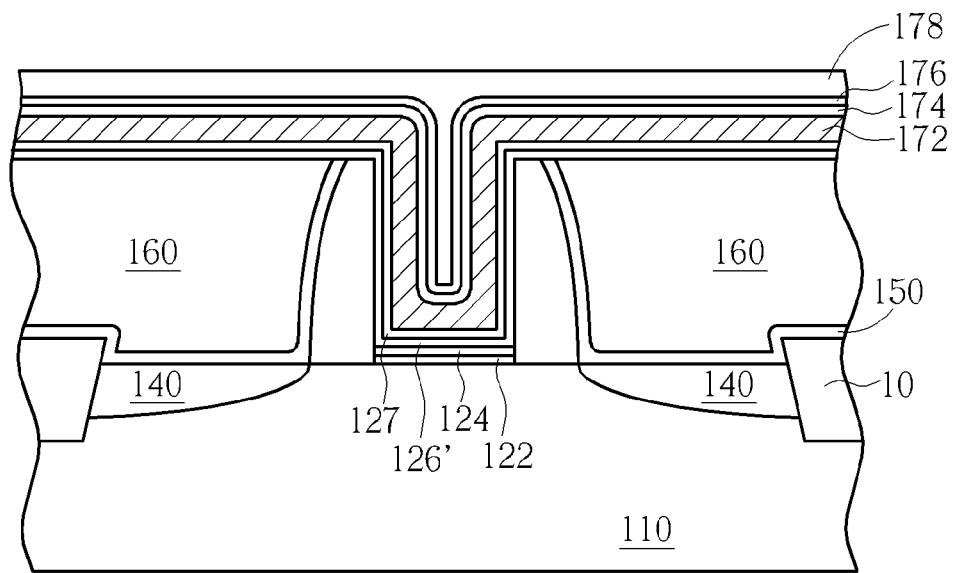

As shown in FIG. 5, a wetting layer 176 is formed on the top barrier layer 174. In this embodiment, the wetting layer 176 may be a titanium layer, but it is not limited thereto. The wetting layer 176 may comprise metals such as titanium, cobalt or ruthenium, and is located between the top barrier layer 174 and a low resistivity material formed later for buffering both of them and enabling the low resistivity material being easier to attach. Then, the low resistivity material 178 is formed on the wetting layer 176. The low resistivity material 178 may be composed of aluminum or tungsten etc. The resistivity of the low resistivity material 178 is lower than the resistivity of the wetting layer 176.

Figure 6:
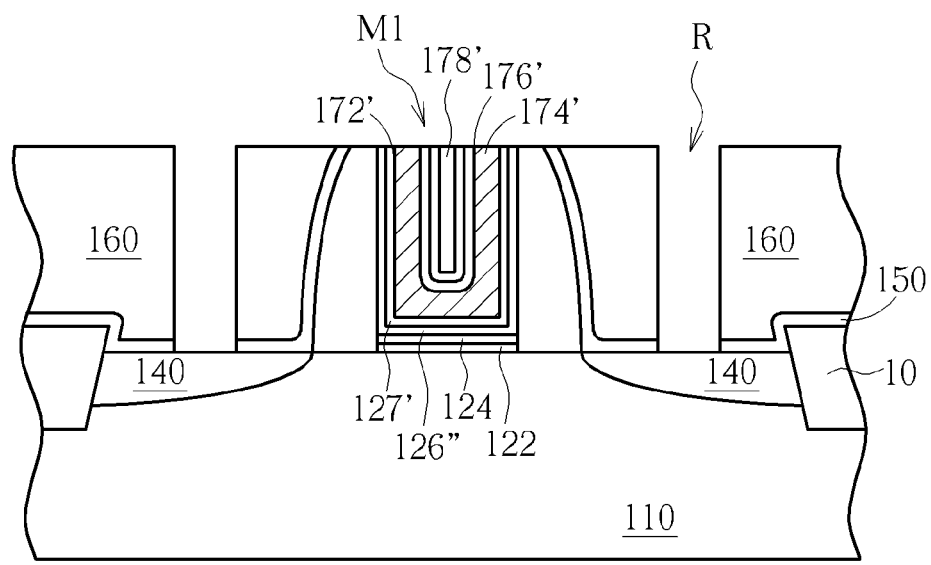

As shown in FIG. 6, a planarizing process such as a chemical mechanical polishing (CMP) process is performed until the interdielectric layer 160 is exposed and a metal gate M1 including the buffer layer 122, the gate dielectric layer 124, a U-shaped bottom barrier layer 126", an etching stop layer 127', a work function layer 172', a top barrier layer 174', a wetting layer 176' and a low resistivity material 178' is therefore formed in the recess r. A lithography process is performed to form at least a contact hole R in the interdielectric layer 160, and the source/drain 140 (or the metal silicide (not shown) is therefore exposed. A metal such as copper is filled into the contact holes R to form the contact plugs (not shown) so as to electrically connect the source/drain 140 to other semiconductor components. Furthermore, the contact plugs (not shown) may be formed above the metal gate M1 to electrically connect the metal gate M1 to other semiconductor components. For example, before the contact holes R are formed, an interdielectric layer (not shown) is formed on the interdielectric layer 160 to cover the interdielectric layer 160 and the metal gate M1. Each of the contact holes R is formed simultaneously in the interdielectric layer (not shown) and the interdielectric layer 160. Then, a metal such as copper is filled into the contact holes R and then is planarized, so that contact plugs (not shown) are formed simultaneously on the source/drain 140 (or the metal silicide (not shown)) and the metal gate M1.

According to the above, the metal gate M1 of the present invention includes a stacked structure composed of the buffer layer 122, the gate dielectric layer 124, the U-shaped bottom barrier layer 126", the etching stop layer 127', the work function layer 172', the top barrier layer 174', the wetting layer 176' and the low resistivity material 178'. As sizes of semiconductor components shrink, these layers formed in the recess r would lead to filling difficulties of the low resistivity material 178' caused by too small remaining opening of the recess r. Besides, many processes must be performed to respectively form these layers, resulting in high processing costs.

Figure 7:
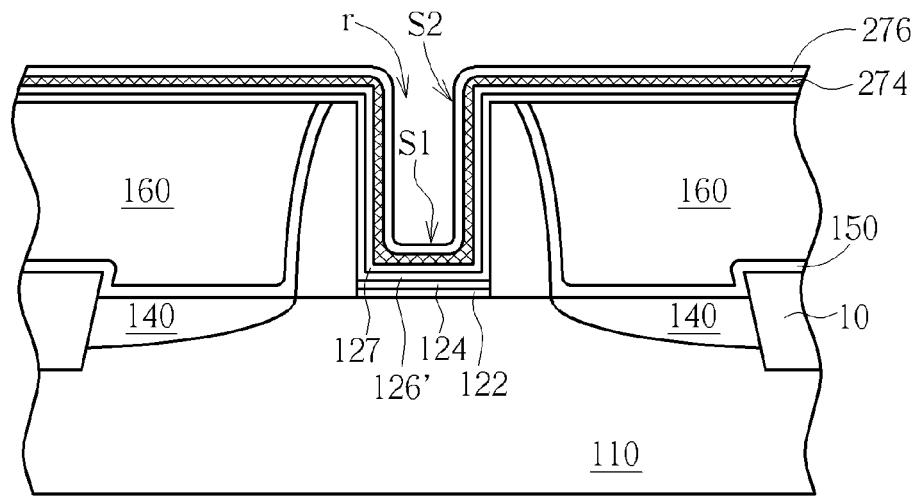
FIGS. 7-9 schematically depict cross-sectional views of a MOS transistor process according to a second embodiment of the present invention.
Figure 8:
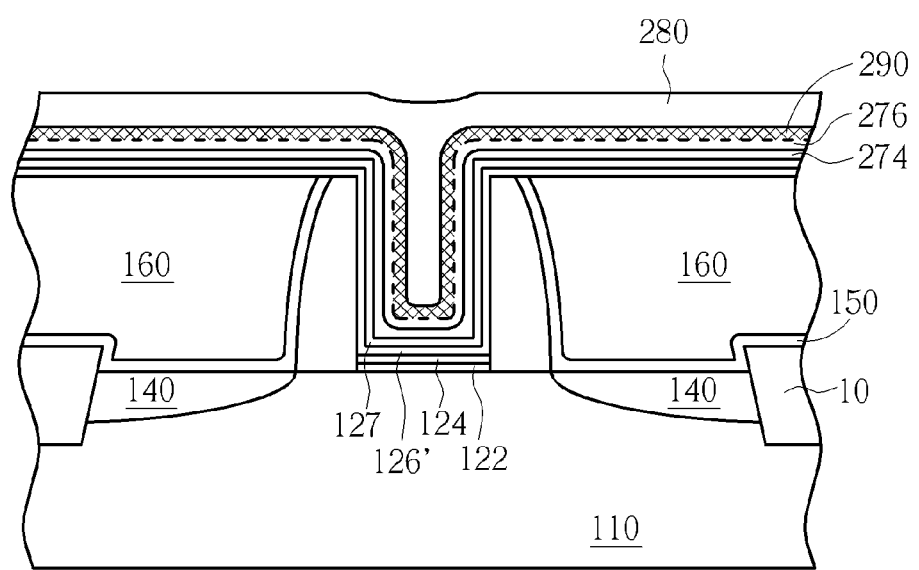
Figure 9:
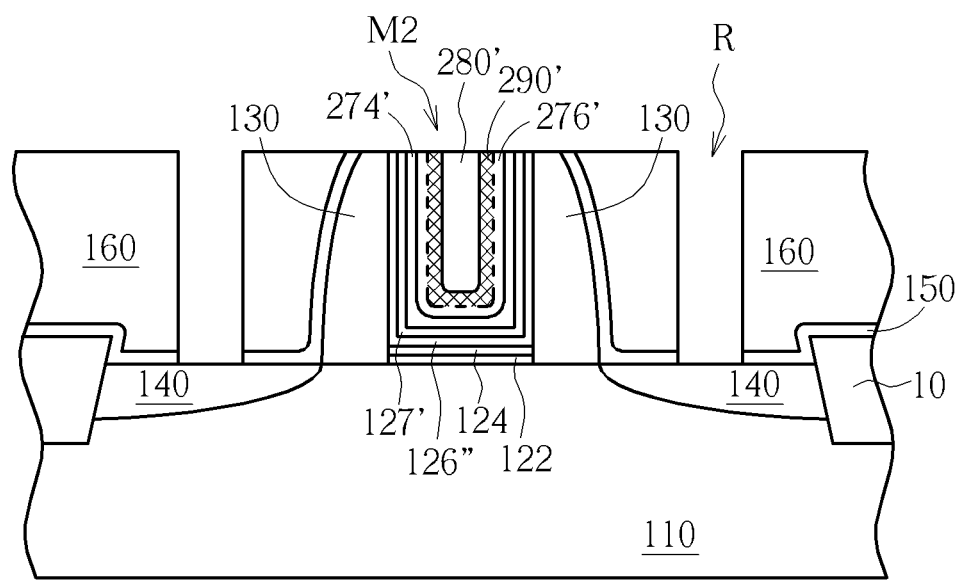

Therefore, the second embodiment of the present invention is presented to further improve the problems of filling difficulties of the first embodiment and simplify the processing flow so as to reduce the processing costs. FIGS. 7-9 schematically depict cross-sectional views of a MOS transistor process according to a second embodiment of the present invention. The previous processing steps of this embodiment are the same as the previous processing steps of the first embodiment as shown in FIGS. 1-3. In other words, in this embodiment, the steps of forming the sacrificial gate G on the substrate 110; forming the spacer 130 on the substrate 110 beside the sacrificial gate G; forming the source/drain 140 in the substrate 110 beside the spacer 130; forming a metal silicide (not shown) on the source/drain 140; selectively forming the contact etch stop layer (CESL) 150 to cover the gate structure G, the spacer 130 and the substrate 110; forming the interdielectric layer 160 and exposing the sacrificial electrode layer 128; forming the recess r thereby exposing the bottom barrier layer 126, or etc, are the same as the first embodiment.

After the recess r is formed and the bottom barrier layer 126 is exposed, the bottom barrier layer 126 is removed and a U-shaped bottom barrier layer 126' is formed to cover the gate dielectric layer 124 and the interdielectric layer 160 as shown in FIG. 7, wherein the U-shaped bottom barrier layer 126' may be a single layer structure or a multilayer structure composed of tantalum nitride (TaN) or titanium nitride (TiN) etc. Then, an etching stop layer 127 is formed on the U-shaped bottom barrier layer 126', wherein the etching stop layer 127 may be composed of tantalum nitride (TaN) or etc for being as an etch stop layer while removing a work function layer of a P-type transistor in a CMOS transistor process. Thereafter, a top barrier layer 274 of the second embodiment directly covers the etching stop layer 127 without forming the work function layer of the first embodiment. A wetting layer 276 is formed on the top barrier layer 274. In a preferred embodiment, the top barrier layer 274 and the wetting layer 276 are formed in-situ. For instance, as the top barrier layer 274 is a titanium nitride layer and the wetting layer 276 is a titanium layer, a deposition process such as a physical vapor deposition (PVD) process can be performed to form the titanium nitride layer by importing nitrogen gas while plating titanium firstly, and then form the titanium layer by stopping importing nitrogen gas and keeping plating titanium, but it is not limited thereto. This way, the thickness of the barrier layer 274 plus the wetting layer 276 can be reduced, and the top barrier layer 274 oxidation before the wetting layer 276 is formed can be avoided, so that a larger thickness of an oxide layer that would reduce the conductivity performances can be avoided. For instance, in the first embodiment, the top barrier layer 174' is a titanium nitride layer with a thickness of 40 angstroms, and the wetting layer 176' is a titanium layer with a thickness of 100 angstroms. Besides, the top barrier layer 174' and the wetting layer 176' are formed in different chambers that will expose the top barrier layer 174' to the air before the wetting layer 176' is formed, thereby affecting the processing yield, leading the top barrier layer 274 to easily oxidize, and rendering the wetting layer 176' not easy to be attached. At the contrary, the thickness of the top barrier layer 274 plus the wetting layer 276 is only 100 angstroms in this embodiment, and the barrier layer 274 and the wetting layer 276 are formed in-situ by controlling the importing time of the nitrogen gas, so that the barrier layer 274 and the wetting layer 276 can bond well, the processing flow can be simplified and the thickness of the top barrier layer 174' of the first embodiment can be reduced. Moreover, the thickness of the bottom layer S1 of the wetting layer 276 is preferred to be larger than the thickness of the sidewalls of the wetting layer 276. For instance, the thickness of the bottom layer S1 of the wetting layer 276 is 80 angstroms, and the thickness of the sidewalls of the wetting layer 276 is 40 angstroms. Therefore, the bottom layer S1 of the wetting layer 276 with a thicker thickness can prevent ingredients from above from diffusing downward while the sidewalls of the wetting layer 276 with a thinner thickness can enlarge the remaining opening of the recess r, so that the low resistivity material can be filled easier into the recess r.

As shown in FIG. 8, a low resistivity material 280 is formed on the wetting layer 276. It is worth noting that, in the second embodiment, the transitional layer 290 is formed between the low resistivity material 280 and the wetting layer 276 by the low resistivity material 280 diffusing into the wetting layer 276. The transitional layer 290 can therefore have the properties of a work function layer, enabling the formed gate structure to have no other work function layers, especially between the top barrier layer 274 and the etching stop layer 127 by selecting the materials of the low resistivity material 280 and the wetting layer 276. Thus, since layers similar to the work function layer 172' of the first embodiment are not formed in the second embodiment, and the top barrier layer 274 and the wetting layer 276 are formed in-situ and can have a thinner thickness, then the filling difficulties of the low resistivity material 280 can be solved and the processing costs can be reduced in this embodiment. Specifically, the wetting layer 276 may be a titanium layer and the low resistivity material 280 may be composed of aluminum. This way, since the low resistivity material 280 such as aluminum diffuses into the wetting layer 276 and reacts with the wetting layer 276 such as titanium, the transitional layer 290 such as an aluminum titanium metal layer can then be formed. The chemical formula of the transitional layer 290 includes $Ti_xAl_y$, with y>x preferably, such as $TiAl_3$ for example, but it is not limited thereto. In this embodiment, the transitional layer 290 is an aluminum titanium metal layer, so that the work function layer 172' of the first embodiment (which is also an aluminum titanium metal layer for forming an NMOS transistor) can be replaced. In another embodiment, the materials of the wetting layer 276 and the low resistivity material 280 may be formed and paired with other materials. For instance, the wetting layer 276 may be composed of titanium, cobalt or ruthenium, and paired with the low resistivity material 280 composed of tungsten or aluminum etc. As the low resistivity material 280 is made of tungsten, it will have lower diffusion velocity than the low resistivity material 280 made of aluminum. Therefore, the thicknesses of the U-shaped bottom barrier layer 126', the etching stop layer 127 and the top barrier layer 274' can be further reduced.

As shown in FIG. 9, a polishing process such as a chemical mechanical polishing (CMP) process is performed to planarize the low resistivity material 280, the transitional layer 290, the wetting layer 276 and the top barrier layer 274, the etching stop layer 127 and the U-shaped bottom barrier layer 126', so that a U-shaped bottom barrier layer 126", an etching stop layer 127', a top barrier layer 274', a wetting layer 276', a transitional layer 290' and a low resistivity material 280' are formed, meaning that a metal gate M2 is formed. Thereafter, at least a contact hole R is formed in the interdielectric layer 160 and the source/drain 140 (or the metal silicide (not shown)) is exposed. Contact plugs (not shown) are formed in the contact holes R, enabling the source/drain 140 (or the metal silicide (not shown)) to electrically connect other semiconductor components. In another embodiment, before the contact holes R are formed, an interdielectric layer (not shown) is formed on the interdielectric layer 160 to cover the interdielectric layer 160 and the metal gate M2. Then, the contact holes R are formed simultaneously in the interdielectric layer (not shown) and the interdielectric layer 160. Metal such as copper is filled into the contact holes R and is planarized to form the contact plugs (not shown) simultaneously on the source/drain 140 (or the metal silicide (not shown)) and the metal gate M2. Thereafter, sequential processes may be performed, which are known in the art, and are not described herein.

According to the above, a MOS transistor can be formed by applying said MOS transistor process, and has the metal gate M2 (or may be named as a gate structure) on the substrate 110 as shown in FIG. 9. The metal gate M2 is a stacked structure including the buffer layer 122, the gate dielectric layer 124, the U-shaped bottom barrier layer 126", the etching stop layer 127', the top barrier layer 274', the wetting layer 276', the transitional layer 290' and the low resistivity material 280' from bottom to top. Since the transitional layer 290' of the present invention has the properties of a work function layer, any other work function layer is not needed in the metal gate M2, especially between the wetting layer 276' and the gate dielectric layer 124. By doing this, due to any other deposition process for forming the work function layer being not needed, the low resistivity material 280' can be filled into the recess r with a larger remaining opening, even when the sizes of semiconductor components shrink. Therefore, the problems of filling difficulties of the first embodiment can be solved and the processing cost can be reduced. For instance, the wetting layer 276' of the present invention may be a titanium layer, the low resistivity material 280' may be composed of aluminum, and the transitional layer 290' formed by both of them can be an aluminum titanium metal layer, having the properties of a work function layer. Moreover, the phase of the transitional layer 290' can be changed by adjusting the processing temperature of the low resistivity material 280' or performing an annealing process after the low resistivity material 280 is formed, so that the microstructure of the transitional layer 290' can be changed, thereby adjusting the electrical parameters, such as work function values, in order to achieve the initial purpose. For instance, the x, y of the chemical formula of the transitional layer 290' being $Ti_xAl_y$ can be adjusted by different processing temperatures of the low resistivity material 280' and different annealing temperatures. The values of x, y may have alternative distributions according to their positions or depths values.

Furthermore, the electrical parameters of transistors such as work functions can be changed by adjusting the thicknesses or the materials of the U-shaped bottom barrier layer 126', the etching stop layer 127, the top barrier layer 274', the wetting layer 276', the transitional layer 290' and the low resistivity material 280'. For example, the quantities of the ingredients of the low resistivity material 280' diffusing into the U-shaped bottom barrier layer 126', the etching stop layer 127, the top barrier layer 274' or even downward to the gate dielectric layer 124 can be controlled by adjusting the thicknesses or the materials of the U-shaped bottom barrier layer 126', the etching stop layer 127 and the top barrier layer 274'. Therefore, the electrical parameters of the transistors such as the work functions, the Equivalent Oxide Thickness (EOT) or the leakage current density (Jg) or etc, can be changed. When the ingredients of the low resistivity material 280' diffuse down to the gate dielectric layer 124, circuit leakage occurs. Thus, it is preferred to control the ingredients of the low resistivity material 280' to just diffuse down to the U-shaped bottom barrier layer 126' or the etching stop layer 127 without diffusing further downwards. Preferably, it is better to increase the thickness of the etching stop layer 127 than to increase the thickness of the U-shaped bottom barrier layer 126' or the top barrier layer 274' since the work functions values will be modified to values inversely proportional to the needs. The method of thickening the etching stop layer 127 may include adding the processing cycles as the etching stop layer 127 is formed by an atomic layer deposition (ALD) process. Moreover, as the material of the top barrier layer 274' is titanium nitride, the content of the ingredients above, such as metal diffusing downwards, can be controlled by adjusting the ratio of nitrogen and titanium, so that the electrical parameters, such as work functions, can be changed. Moreover, since the downwards diffusion of the ingredients above the U-shaped bottom barrier layer 126' or the etching stop layer 127 can be avoided by adjusting the U-shaped bottom barrier layer 126' or the etching stop layer 127, the top barrier layer 274' can be omitted to further reduce the processing costs and overcome filling difficulties.

To summarize, the present invention provides a MOS transistor and a process thereof that forms a wetting layer and a low resistivity material, and then a transitional layer is formed between the wetting layer and the low resistivity material by diffusing ingredients of the low resistivity material into the wetting layer, wherein the transitional layer has the properties of a work function layer, so that no work function layers is formed in the MOS transistor. This way, the MOS transistor and its process thereof can overcome filling difficulties and reduce the processing costs. Moreover, the electrical parameters of the transistor such as work function, Equivalent Oxide Thickness (EOT) or leakage current density (Jg) can be changed by adjusting the materials and the thicknesses of the bottom barrier layer, the etching stop layer, the top barrier layer, the wetting layer, the transitional layer and the low resistivity material.

Furthermore, the top barrier layer and the wetting layer of the present invention can be formed in-situ. For instance, as the top barrier layer is a titanium nitride layer and the wetting layer is a titanium layer, a deposition process such as a physical vapor deposition (PVD) process can be performed to form the titanium nitride layer by importing nitrogen gas while plating titanium firstly, and then form the titanium layer by stopping importing nitrogen gas while keeping plating titanium. By doing this, the thickness of the top barrier layer plus the wetting layer can be reduced and the top barrier layer oxidized before the wetting layer is formed can be avoided.

Although the U-shaped bottom barrier layer 126", the etching stop layer 127', the top barrier layer 274', the wetting layer 276', the transitional layer 290' and the low resistivity material 280' all have co-planar (aligned) top surfaces, it is noted that an etching back process can be performed upon one or more of these films after their formation and before the chemical mechanical polishing process mentioned in regard to FIG. 9 to make their top surfaces lower than the top surface of the polished interdielectric layer 160.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A MOS transistor, comprising:
a gate structure located on a substrate, the gate structure comprising a wetting layer, a transitional layer and a low resistivity material from bottom to top, wherein the wetting layer has a bottom layer and sidewalls and the bottom layer has a thickness larger than that of the sidewalls, the transitional layer is a composition reacting from the wetting layer and the low resistivity material and has the properties of a work function layer.

2. The MOS transistor according to claim 1, wherein the wetting layer comprises titanium, cobalt or ruthenium.

3. The MOS transistor according to claim 1, wherein the resistivity of the low resistivity material is lower than the resistivity of the wetting layer and the transitional layer, and the low resistivity material comprises aluminum or tungsten.

4. The MOS transistor according to claim 1, wherein the transitional layer comprises TixAly.

5. The MOS transistor according to claim 4, wherein the transitional layer comprises TiAl3.

6. The MOS transistor according to claim 1, wherein the MOS transistor comprises a NMOS transistor.

7. The MOS transistor according to claim 1, wherein the gate structure further comprises a dielectric layer, a bottom barrier layer and an etching stop layer from bottom to top, located between the substrate and the wetting layer.

8. The MOS transistor according to claim 7, wherein the bottom barrier layer comprises a titanium nitride layer, and the etching stop layer comprises a tantalum nitride layer.

9. The MOS transistor according to claim 1, wherein the gate structure further comprises a top barrier layer located between the substrate and the wetting layer.

10. The MOS transistor according to claim 9, wherein the top barrier layer comprises a titanium nitride layer.

11. A MOS transistor process, comprising:
forming a gate structure on a substrate, and the gate structure comprising a wetting layer, a transitional layer and a low resistivity material from bottom to top, wherein the wetting layer has a bottom layer and sidewalls and the bottom layer has a thickness larger than that of the sidewalls, the transitional layer is formed by the low resistivity material diffusing into the wetting layer, and the transitional layer has the properties of a work function layer.

12. The MOS transistor process according to claim 11, wherein the wetting layer comprises titanium, cobalt or ruthenium.

13. The MOS transistor process according to claim 11, wherein the low resistivity material comprises aluminum or tungsten.

14. The MOS transistor process according to claim 11, wherein the transitional layer comprises TixAly.

15. The MOS transistor process according to claim 14, wherein the transitional layer comprises TiAl3.

16. The MOS transistor process according to claim 11, wherein the MOS transistor comprises a NMOS transistor.

17. The MOS transistor process according to claim 11, wherein steps of forming the gate structure comprise:
   forming a dielectric layer, a bottom barrier layer and an etching stop layer from bottom to top and located between the substrate and the wetting layer.

18. The MOS transistor process according to claim 11, wherein steps of forming the gate structure comprise:
   forming a top barrier layer between the substrate and the wetting layer.

19. The MOS transistor process according to claim 18, wherein the top barrier layer and the wetting layer are in-situ formed.

20. The MOS transistor process according to claim 19, wherein the top barrier layer comprises a titanium nitride layer and the wetting layer comprises a titanium layer.

* * * * *